(12) United States Patent
Yi et al.

(10) Patent No.: US 9,268,168 B2
(45) Date of Patent: Feb. 23, 2016

(54) LIQUID CRYSTAL DISPLAY DEVICE AND METHOD OF FABRICATING THE SAME

(71) Applicant: LG Display Co., Ltd., Seoul (KR)

(72) Inventors: HyoJong Yi, Paju-si (KR); DongIn Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/547,212

(22) Filed: Nov. 19, 2014

(65) Prior Publication Data
US 2015/0138480 A1    May 21, 2015

(30) Foreign Application Priority Data

Nov. 20, 2013 (KR) .................... 10-2013-0141701

(51) Int. Cl.
*G02F 1/1335* (2006.01)
*H01L 27/12* (2006.01)
*G02F 1/1362* (2006.01)
*G02F 1/1343* (2006.01)

(52) U.S. Cl.
CPC .... *G02F 1/133514* (2013.01); *G02F 1/133516* (2013.01); *G02F 1/136209* (2013.01); *G02F 1/136286* (2013.01); *H01L 27/124* (2013.01); *H01L 27/1259* (2013.01); *G02F 1/13439* (2013.01); *G02F 1/133512* (2013.01); *G02F 2001/136222* (2013.01)

(58) Field of Classification Search
CPC ..... F21V 29/02; F21K 9/13; G02F 1/136209; G02F 2001/136222; G02F 1/133512; G02F 1/13439
See application file for complete search history.

(56) References Cited

U.S. PATENT DOCUMENTS

| | | | |
|---|---|---|---|
| 2009/0101908 A1* | 4/2009 | Kwack | G02F 1/136286 257/59 |
| 2013/0228756 A1* | 9/2013 | Lee | H01L 51/52 257/40 |

* cited by examiner

*Primary Examiner* — Michael Caley
*Assistant Examiner* — Jacob R Stern
(74) *Attorney, Agent, or Firm* — Dentons US LLP

(57) ABSTRACT

A liquid crystal display device having a color filter on TFT (COT) structure for high picture quality, high performance display and a method of fabricating the same are provided to reduce the luminance difference between a pixel portion and an outer portion by laminating color pigments in black matrix regions, forming a light blocking pattern to use as a black matrix, and configuring the light blocking pattern to have three layers to achieve black luminance.

19 Claims, 16 Drawing Sheets

LIQUID CRYSTAL DISPLAY DEVICE AND METHOD OF FABRICATING THE SAME

CROSS-REFERENCE TO RELATED APPLICATION

Pursuant to 35 U.S.C. §119(a), this application claims the benefit of earlier filing date and right of priority to Korean Application No. 10-2013-0141701, filed on Nov. 20, 2013, which is incorporated by reference herein in its entirety for all purposes.

BACKGROUND OF THE DISCLOSURE

1. Field of the Disclosure

This specification relates to a liquid crystal display device and a method of fabricating the same. More particularly, the specification relates to a liquid crystal display device having a color filter on TFT (COT) structure in which color filters, along with a thin film transistor, are formed on an array substrate, and a method of fabricating the same.

2. Background of the Disclosure

In general, a liquid crystal display device displays a desired image by individually providing data signals corresponding to image information to pixels arranged in a matrix form and controlling the light transmittance of the pixels.

Accordingly, the liquid crystal display device includes both a liquid crystal display panel where pixels are arranged in a matrix form and a driving unit for driving the pixels.

The liquid crystal display panel includes a thin film transistor array substrate and a color filter substrate which face each other and are attached such that they have a uniform cell gap therebetween and a liquid crystal layer in the cell gap.

A common electrode and a pixel electrode are formed on the liquid crystal display panel in which the array substrate and the color filter substrate are attached to each other in order to apply an electric field to the liquid crystal layer.

When a voltage of a data signal supplied to the pixel electrode is controlled such that a voltage is supplied to the common electrode, liquid crystal in the liquid crystal layer rotates due to a dielectric anisotropy according to the electric field formed between the common electrode and the pixel electrode. As a result, light is transmitted or blocked in each pixel thereby displaying a character or an image.

FIG. 1 is a view schematically showing a cross-section structure of a general liquid crystal device, which takes part of the cross-section structure of a data line area as an example.

Referring to FIG. 1, the general liquid crystal display device includes two glass substrates 5 and 10 and a liquid crystal layer (not shown) formed between the two glass substrates 5 and 10, with a cell gap maintained between them by a column spacer 40.

A gate line (not shown) and a data line 17 arranged in a matrix and defining pixel regions are formed on the lower glass substrate 10, and a thin film transistor, which is a switching element, is formed at the crossing of the gate line and the data line 17.

For an in-plane switching (IPS) mode, although not shown, a plurality of pixel electrodes and common electrodes for forming an electric field are alternately arranged within the pixel regions.

The thin film transistor includes a gate electrode connected to the gate line, a source electrode connected to the data line 17, and a drain electrode connected to a pixel electrode. Further, the thin film transistor includes a plurality of insulation films 15a, 15b, and 15c for insulation between these components and an active pattern that forms a conductive channel between the source electrode and the drain electrode by a gate voltage supplied to the gate electrode.

A color filter array is formed on the upper glass substrate 5, and the color filter array includes a black matrix 6, color filters 7, and an overcoat layer 9.

The general LCD device thus configured can bring about improvements in productivity and profitability as the size of a mother substrate for manufacturing a liquid crystal panel becomes larger, but has reduced the aperture ratio due to the increase in an attachment margin, that is, the width of the black matrix 6, in the manufacture of a liquid crystal panel. This lowers luminance and limits resolution, thus causing a decline in competitiveness.

SUMMARY OF THE DISCLOSURE

An aspect of the detailed description is to provide a liquid crystal display device having a color filter on TFT (COT) structure in which color filters, along with a thin film transistor, are formed on an array substrate, and a method of fabricating the same.

Another aspect of the detailed description is to provide a liquid crystal display device having a COT structure, which can improve the picture quality and luminance of a display as well as its performance by eliminating a black matrix, and a method of fabricating the same.

Additional features of the present invention will be described in configurations of the present invention and the appended claims that will be described below.

To achieve these and other advantages and in accordance with the purpose of this specification, as embodied and broadly described herein, there is provided a method of fabricating a liquid crystal display device, the method including the steps of: forming a gate line and a data line that cross each other on a first substrate to define red, green, and blue pixel regions; forming a thin film transistor at the crossing of the gate line and the data line; forming red, green, and blue color filters within the red, green, and blue pixel regions of the first substrate where the thin film transistor is formed; forming a light blocking layer at the upper and lower boundaries of the pixel regions by laminating color pigments for the red, green, and blue color filters; forming a plurality of common electrodes and pixel electrodes within the pixel regions of the first substrate where the red, green, and blue color filters and the light blocking layer are formed; forming a light blocking pattern at left and right boundaries of the pixel regions over the data line; and attaching the first substrate and a second substrate together, wherein the common electrodes, the pixel electrodes, and the light blocking pattern have a triple-layer structure consisting of lower and upper layers with low reflection and transmission characteristics and an intermediate layer which is light-transmissive.

The method may further include the step of forming a common line in parallel with the gate line so as to be adjacent to the upper or lower side of the gate line.

In another aspect of the present invention, there is provided a liquid crystal display device including: a gate line and a data line formed on a first substrate and crossing each other to define red, green, and blue pixel regions; a thin film transistor formed at the crossing of the gate line and the data line; red, green, and blue color filters formed within the red, green, and blue pixel regions of the first substrate where the thin film transistor is formed; a light blocking layer formed at and lower boundaries of the pixel regions by laminating color pigments for the red, green, and blue color filters; a plurality of common electrodes and pixel electrodes formed within the pixel regions of the first substrate where the red, green, and blue color filters and the light blocking layer are formed; a light blocking pattern formed at left and right boundaries of the pixel regions over the data line; and a second substrate attached to the first substrate and facing each other, wherein the common electrodes, the pixel electrodes, and the light blocking pattern have a triple-layer structure consisting of lower and upper layers with low reflection and transmission characteristics, and an intermediate layer which is light-transmissive.

The liquid crystal display device may further include a common line that is formed in parallel with the gate line so as to be adjacent to the upper or lower side of the gate line.

One end of the common electrodes and one end of the light blocking pattern may be connected to a common electrode line, which is in parallel with the gate line, and the common electrode line may be electrically connected to the underlying common line.

One end of the pixel electrodes may be connected to a pixel electrode line, which is in parallel with the gate line, and the pixel electrode line may be electrically connected to the drain electrode of the thin film transistor.

The upper and lower layers of the common electrodes, pixel electrodes, and light blocking pattern may be made of an opaque conductive material such as ceramic, metal oxide, MoTi, or copper.

The intermediate layers of the common electrodes, pixel electrodes, and light blocking pattern may be made of a transparent conductive material such as indium tin oxide (ITO) or indium zinc oxide (IZO).

The light blocking layer may have a lamination structure of red and blue color layers made of color pigments for the red and blue color filters.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Figure 1:
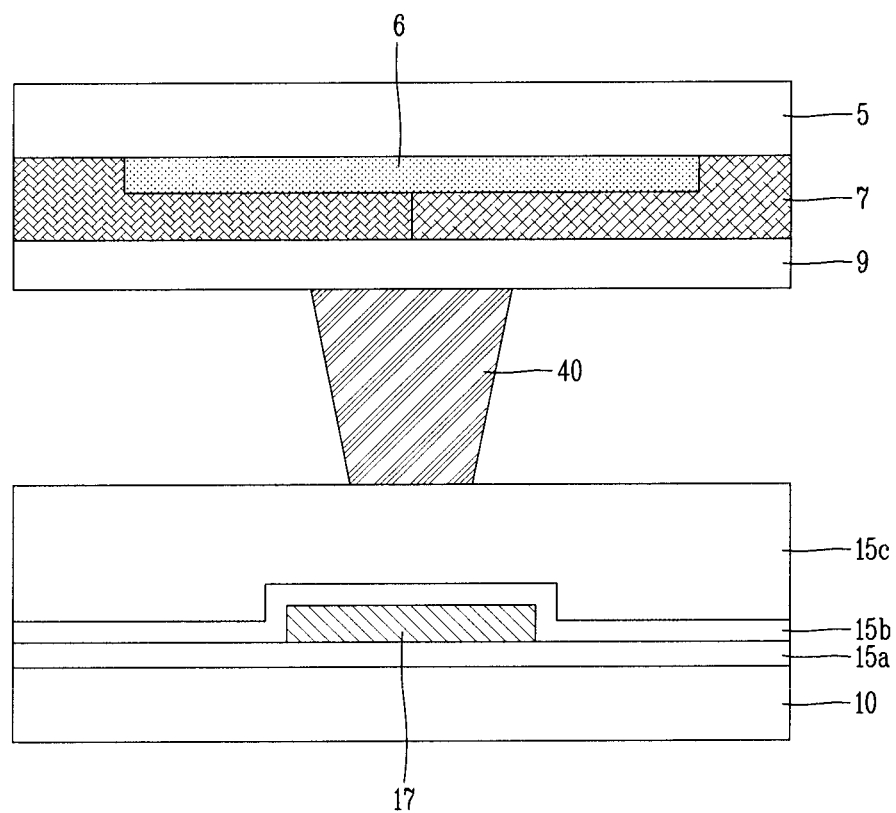
FIG. 1 is a view schematically showing a cross-section structure of a general liquid crystal display device.

Hereinafter, a liquid crystal display device and a method of fabricating the same according to a preferred embodiment of the present invention will be described with reference to the accompanying drawings so that those skilled in the art can easily practice the invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the size and relative sizes of layers and regions may be exaggerated for clarity.

It will be understood that when an element or a layer is referred to as being "on" or "over" another element or layer, it can be directly on or directly over the other element, or intervening elements may also be present. In contrast, when an element is referred to as being "directly on" or "directly over" another element, there are no intervening elements present.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if an element illustrated in the drawings is turned over, the element described to be "below" or "beneath" another element may be put "above" the other element. Accordingly, the exemplary wording "below" may include both directions corresponding to "below" and "above".

The terms used in the present specification are used to describe example embodiments of inventive concepts, and not to limit the inventive concepts. A singular form may include a plural form, unless otherwise defined. The term "comprise" and/or "comprising" specify the existence of mentioned components, steps, operations and/or elements thereof, and do not exclude existence or addition of one or more components, steps, operations and/or elements thereof.

Figure 2:
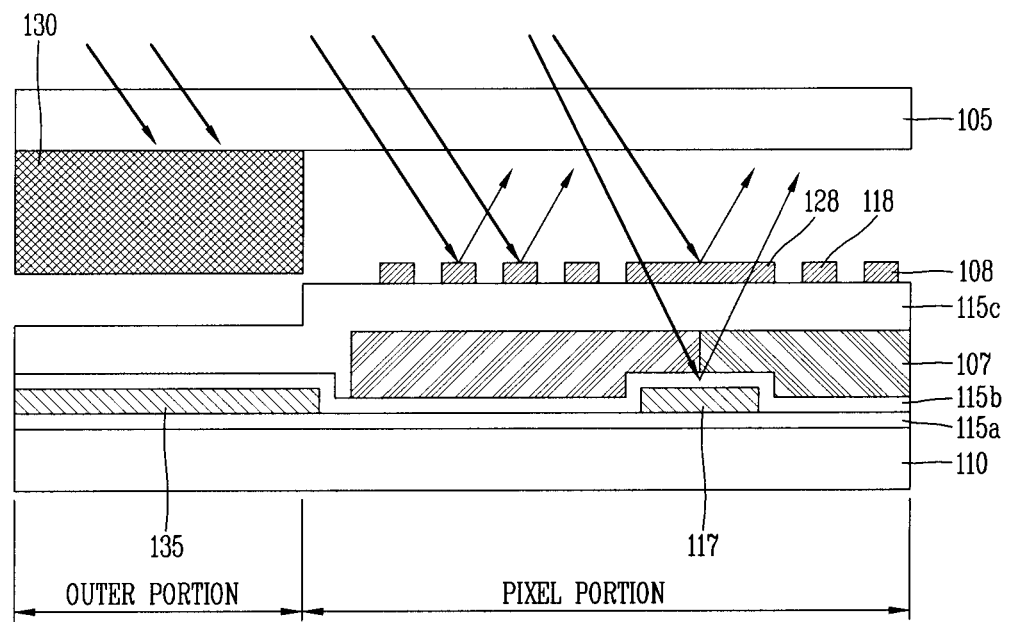
FIG. 2 is a view schematically showing an example of a cross-section structure of a liquid crystal display device according to an embodiment of the present invention.

FIG. 2 is a view schematically showing an example of a cross-section structure of a liquid crystal display device according to an embodiment of the present invention, which takes part of the cross-section structure of an edge region of a pixel portion as an example.

Referring to FIG. 2, the liquid crystal display device according to the embodiment of the present invention includes two substrates 105 and 110 divided into a pixel portion and an outer portion and a liquid crystal layer (not shown) formed between them.

A gate line (not shown) and a data line 117 arranged in a matrix and defining pixel regions are formed in the pixel portion of the lower array substrate 110, and a thin film transistor, which is a switching element, is formed at the crossing of the gate line and the data line 117.

For an in-plane switching (IPS) mode, for example, although not shown, a plurality of pixel electrodes 108 and common electrodes 118 for forming an electric field are alternately arranged within the pixel regions.

Although not shown, the thin film transistor includes a gate electrode connected to the gate line, a source electrode connected to the data line 117, and a drain electrode electrically connected to a pixel electrode 118. Further, the thin film transistor includes a plurality of insulation films 115a, 115b, and 115c for insulation between these components and an active pattern that forms a conductive channel between the source electrode and the drain electrode by a gate voltage supplied to the gate electrode.

The array substrate 110 thus configured has a color filter on TFT (COT) structure in which color filters 107 are formed on the thin film transistor.

A predetermined circuit line 135 may be formed in the outer portion of the array substrate 110. A black column spacer (BCS) 130 is formed in the outer portion of the upper substrate 105, thereby preventing light from the backlight from leaking out to the bezel portion of the liquid crystal panel.

The liquid crystal display device according to the embodiment of the present invention thus configured is characterized in that, instead of eliminating the existing black matrix, a light blocking pattern 128 made of an opaque conductive material is formed at the left and right boundaries of the pixel regions, i.e., in horizontal black matrix regions and color pigments are laminated at the upper and lower boundaries of the pixel regions, i.e., in vertical black matrix regions.

The light blocking pattern 128 is formed over the data line 117 to cover the data line 117, thereby preventing color interference between neighboring sub-pixels.

The light blocking pattern 128 may be made of a conductive material having low reflection characteristics, similar to a material for the common electrodes 108 and the pixel electrodes 118, when internal electrodes, i.e., the common electrodes 108 and the pixel electrodes 118, are formed on the array substrate 110.

For example, an opaque conductive material such as copper Cu, aluminum Al, molybdenum Mo, or molybdenum alloy and a transparent conductive material such as indium tin oxide (ITO) are commonly used as the existing wiring electrode. Regarding a general model using a black matrix, there has been no issue with the optical characteristics of electrodes since the black matrix acts as a blocking film.

For the development of display products, however, it is necessary to meet the demand for high performance and high quality and strengthen price competitiveness by lowering costs.

To this end, various efforts are being made in many areas including materials, process development, and design improvement. Consequently, a black-matrix-less model has been developed in order to improve the luminance of display products and the efficiency of backlights by improvement in transmittance in the development of high-performance, high-quality display products.

However, the black-matrix-less model has more electrode-exposing regions, so the high reflectance of highly-conductive electrodes may affect picture quality and luminance. That is, the aforementioned opaque conductive material is glossy and highly reflective by nature, whereas transparent conductive material has low reflectance but is not applicable in terms of contrast ratio due to its high transmittance.

Moreover, the difference between the reflectance of the electrodes (i.e., the internal electrodes 108 and 118 and light blocking pattern 128) in the pixel portion and the reflectance of the outer portion necessarily leads to a luminance difference. That is, in a black-matrix-less COT model, the internal electrodes 108 and 118 and the light blocking pattern 128 also serve as a black matrix, and a luminance difference (~level 4.0) occurs due to the difference between the reflectance (~61%) of the internal electrodes 108 and 118 and light blocking pattern 128 in the black matrix regions of the pixel portion and the reflectance (~0%) of the black column spacer 130 in the outer portion.

In view of this, it is necessary to develop electrode materials having excellent optical characteristics, such as low reflectance and low transmittance, and high reflection characteristics, in order to improve picture quality and increase the luminance of products Hereupon, the internal electrodes and light blocking pattern, which substitute for the black matrix, are formed in, for example, a triple-layer structure according to the present invention. This will be described below in detail by taking another example.

Figure 3:
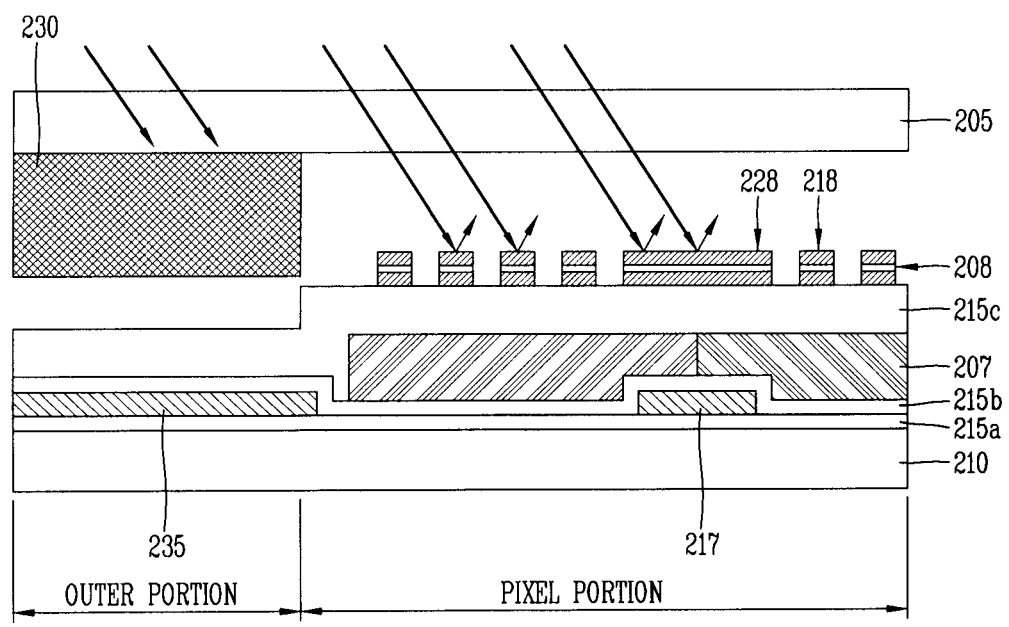
FIG. 3 is a view schematically showing another example of the cross-section structure of the liquid crystal display device according to the present invention.

FIG. 3 is a view schematically showing another example of the cross-section structure of the liquid crystal display device according to the present invention, which takes part of the cross-section structure of an edge region of the pixel portion as an example.

Figure 4:
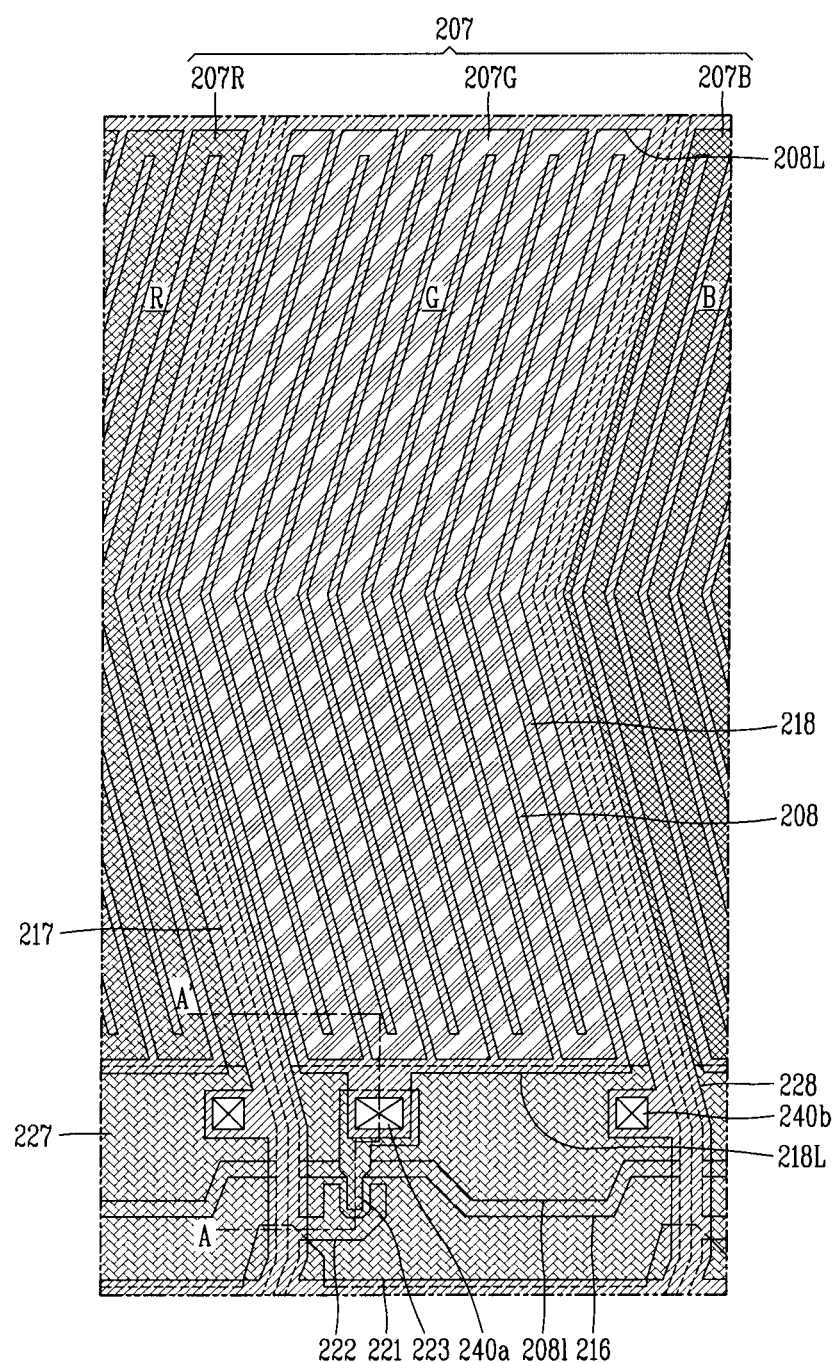
FIG. 4 is a top plan view schematically showing part of the array substrate of the liquid crystal display device according to the embodiment of the present invention.

FIG. 4 is a top plan view schematically showing part of the array substrate of the liquid crystal display device according to the embodiment of the present invention, which takes part of the components on the array substrate of an in-plane switching mode liquid crystal display device as an example. However, the present invention is not limited to this in-plane switching mode liquid crystal display device.

While, in the actual liquid crystal display device, (M×N) sub-pixels are present at the crossings of N gate lines and M data lines, this figure illustrates only one pixel consisting of red, green, and blue sub-pixels R, G, and B.

Figure 5:
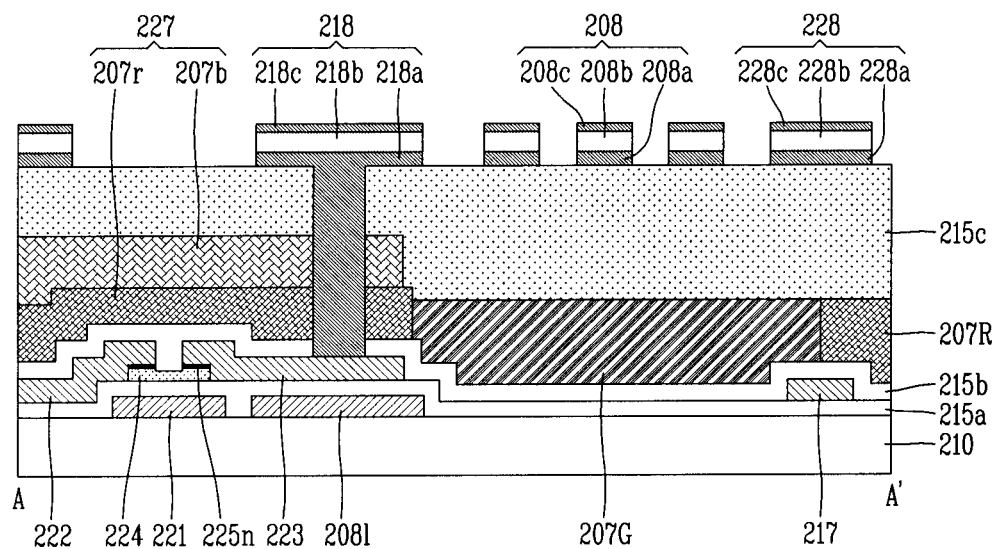
FIG. 5 is a view schematically showing a cross-section taken along the line A-A' on the array substrate of FIG. 4 according to the embodiment of the present invention.

FIG. 5 is a view schematically showing a cross-section taken along the line A-A' on the array substrate of FIG. 4 according to the embodiment of the present invention.

As shown in FIGS. 4 and 5, if the common electrodes and the pixel electrodes have a bent structure, the liquid crystal molecules are arranged in two directions and form two domains, which gives a wider viewing angle compared to a mono-domain structure. However, the present invention is not limited to the in-plane switching mode liquid crystal display device having a two-domain structure, but is applicable to any in-plane switching mode liquid crystal display device having a multi-domain structure with two or more domains. Also, the common electrodes and pixel electrodes of the present invention may have a structure other than the bent structure.

Referring to FIGS. 3 to 5, the liquid crystal display device according to an embodiment of the present invention may include two substrates 205 and 210 divided into a pixel portion and an outer portion and a liquid crystal layer (not shown) formed between the two substrates.

A gate line 216 and a data line 217 arranged in a matrix and defining pixel regions are formed in the pixel portion of the lower array substrate 210. That is, the gate line 216 supplies a scan signal from a gate driver (not shown), and the data line 217 supplies a video signal from a data driver (not shown). The gate line 216 and the data line 217 cross each other with a gate insulation film 215a interposed between them, thereby defining pixel regions.

A thin film transistor, which is a switching element, is formed at the crossing of the gate line 216 and the data line 217. A plurality of pixel electrodes 218 and common electrodes 208 for forming an electric field and driving the liquid crystal molecules are alternately arranged within the pixel regions.

A predetermined circuit line 235 may be formed in the outer portion of the array substrate 210. A black column spacer (BCS) 230 is formed in the outer portion of the upper substrate 205, thereby preventing light from the backlight from leaking out to the bezel portion of the liquid crystal panel.

The thin film transistor responds to a scan signal of the gate line 216 to cause a video signal on the data line 217 to be charged and maintained in the pixel electrode 218. To this end, the thin film transistor includes a gate electrode 221 connected to the gate line 216, a source electrode 222 connected to the data line 217, and a drain electrode 223 electrically connected to the pixel electrode 218.

Further, the thin film transistor includes a plurality of insulation films 215a, 215b, and 215c for insulation between these components and an active pattern 224 that forms a conductive channel between the source electrode 222 and the drain electrode 223 by a gate voltage supplied to the gate electrode 221.

The active pattern 224 may be made of an amorphous silicon thin film, polycrystalline silicon thin film, or oxide semiconductor. For the active pattern 224 made of an amorphous silicon thin film, for example, the source/drain regions of the active pattern 224 are electrically connected to the source/drain electrodes via an ohmic-contact layer 225n formed over the active pattern 224.

According to the embodiment of the present invention, as the common electrodes 208, pixel electrodes 218, and data line 217 are bent to have the multi-domain structure allowing the liquid crystal molecules to be symmetrically driven, abnormal light caused by birefringence characteristics of liquid crystal can be canceled out to minimize a color shift phenomenon. Namely, the color shift phenomenon occurs according to a visual field for viewing liquid crystal molecules due to the birefringence characteristics of the liquid crystal molecules, and in particular, a yellow shift is observed in a short axis direction of the liquid crystal molecules, and a blue shift is observed in a longer axis direction of the liquid crystal molecules. Thus, the birefringence value can be compensated by appropriately disposing the shorter and longer axis of the liquid crystal molecules to reduce or remove the color shift.

The array substrate 210 thus configured according to the embodiment of the present invention is characterized in that it has a COT structure in which the color filters 207 are formed over the thin film transistor.

The liquid crystal display device according to the embodiment of the present invention thus configured is characterized in that, instead of eliminating the existing black matrix, a light blocking pattern 228 made of an opaque conductive material is formed at the left and right boundaries of the pixel regions and a light blocking layer 227 made of color pigments is laminated at the upper and lower boundaries of the pixel regions.

The light blocking pattern 228 is formed over the data line 217 to cover the data line 217, thereby preventing color interference between neighboring sub-pixels.

The light blocking pattern 228 may have a triple-layer structure consisting of upper and lower layers with low reflectance and low transmittance and an intermediate layer as an intermediate medium, like the common electrodes 208 and the pixel electrodes 218, when internal electrodes, i.e., the common electrodes 208 and the pixel electrodes 218, are formed on the array substrate 210.

That is, the common electrodes 208 may have a triple-layer structure consisting of lower and upper common electrode layers 208a and 208c with low reflection and transmission characteristics and an intermediate common electrode layer 208b which is light-transmissive. The light blocking pattern 228 may have a triple-layer structure consisting of lower and upper light blocking pattern layers 228a and 228c with low reflection and transmission characteristics and an intermediate light blocking pattern layer 228b which is light-transmissive.

One end of the common electrodes 208 and one end of the light blocking pattern 228 formed over the data line 217 are connected to a common electrode line 208L, which is in parallel with the gate line 216, and the common electrodes 208 and the light blocking pattern 228 are electrically connected to a common line 208l, which is in parallel with the gate line 216, via a second contact hole 240b.

The pixel electrodes 218 may be made of the same material on the same plane as the common electrodes 208. That is, the pixel electrodes 218 may have a triple-layer structure consisting of lower and upper pixel electrode layers 218a and 218c with low reflection and transmission characteristics and an intermediate pixel electrode layer 218b which is light-transmissive.

One end of the pixel electrodes 218 are connected to a pixel electrode line 218L, which is in parallel with the gate line 216, and the pixel electrode line 218L is electrically connected to the drain electrode 223 of the thin film transistor exposed via a first contact hole 240a.

A reference voltage for driving the liquid crystals, i.e., a common voltage, is supplied to the thus-configured common electrodes 208 via the common line 208l. Accordingly, a horizontal electric field is formed between the pixel electrodes 218 supplied with a pixel voltage signal and the common electrodes 208 supplied with a common voltage. This horizontal electric field causes the liquid crystal molecules arranged in a horizontal direction between the array substrate 210 and the upper substrate 205 to rotate by dielectric anisotropy. Light transmission through the pixel regions differs depending on the amount of rotation of the liquid crystal molecules, thereby displaying an image.

As described above, according to the embodiment of the present invention, the color filters 207 are formed on the same array substrate 210 as the thin film transistor so as to have a COT structure.

In an example, the color filters 207 include a red color filter 207R, a green color filter 207G, and a blue color filter 207B, which are arranged in a repeating fashion along the length of the gate line 216, but same color filters are repeated along the length of the data line 217. The red color filter 207R, green color filter 207G, and blue color filter 207B constitute a unit pixel, and the unit pixel displays an image having a predetermined color via colored light emitted through the red, green, and blue color filters.

Figure 6:
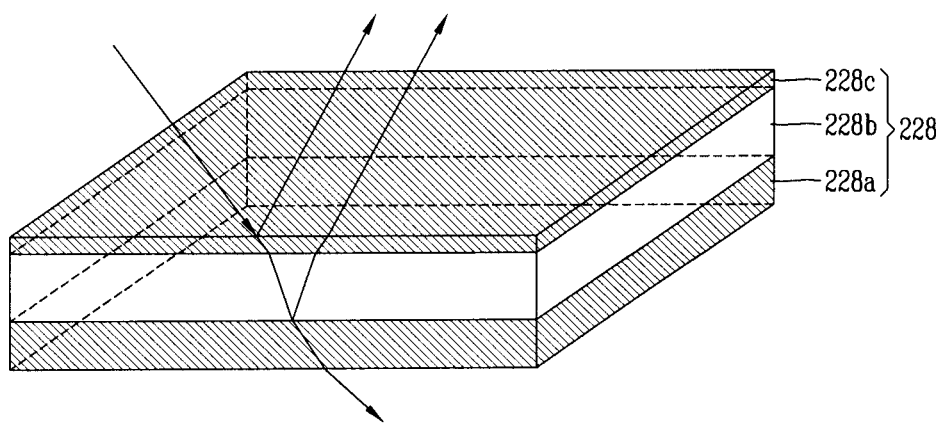
FIG. 6 is a view illustrating a triple-layer structure of the light blocking pattern in the liquid crystal display device according to the embodiment of the present invention.

FIG. 6 is a view illustrating a triple-layer structure of the light blocking pattern in the liquid crystal display device according to the embodiment of the present invention.

Referring to FIG. 6, the light blocking pattern 228 according to the embodiment of the present invention is characterized in that it has a triple-layer structure of upper and lower light blocking pattern layers 228c and 228a with low reflection and transmission characteristics and an intermediate light blocking pattern layer 228b which is light-transmissive.

For example, the upper and lower light blocking pattern layers 228c and 228a may be made of an opaque conductive material such as ceramic, metal oxide, MoTi, or copper, and the intermediate light blocking pattern layer 228b may be made of a transparent conductive material such as indium tin oxide (ITO) or indium zinc oxide (IZO).

By laminating the three layers of the light blocking pattern 228, reflectance luminance can be improved by constructive and destructive interference of light using the reflection characteristics of the upper and lower layers and the transmission and refraction characteristics of the intermediate layer. For example, the reflectance of the entire light blocking pattern 228 is lowered using the reflection and transmission characteristics relative to the refractive index of ITO and the thickness of MoTi of the upper and lower layers. The path difference between light reflected by the upper light blocking pattern layer 228c and light reflected by the lower light blocking pattern layer 228a causes destructive interference.

The light blocking pattern 228 having the triple-layer structure can achieve black luminance since it has low reflection and transmission characteristics, as well as electric characteristics similar to those of conventional low-resistance electrodes. For example, it can be seen that the light blocking pattern 228 having the triple-layer structure consisting of MoTi/ITO/MoTi has a reflectance of about 13.43%, which is quite small compared to the conventional art (for example, about 61.0% for MoTi of 300 Å thickness).

The upper light blocking pattern layer 228c, the intermediate light blocking pattern layer 228b, and the lower light blocking pattern layer 228a may have a thickness of 30 to 100 Å, 400 to 600 Å, and 100 to 300 Å, respectively.

For example, black luminance can be achieved by using the triple-layer structure of MoTi/ITO/MoTi, and although different according to other conditions, the best characteristics can be obtained when the upper MoTi layer has 30 Å thickness.

Moreover, the larger the thickness of the lower MoTi layer, the deeper the black luminance because of light cancellation at the upper and lower layers.

Hereinafter, a method of fabricating a liquid crystal display device will be described in detail with reference to the accompanying drawings.

FIGS. 7A to 7H are top plan views sequentially showing a fabrication process of the array substrate of FIG. 5 according to an embodiment of the present invention.

Figure 7A:
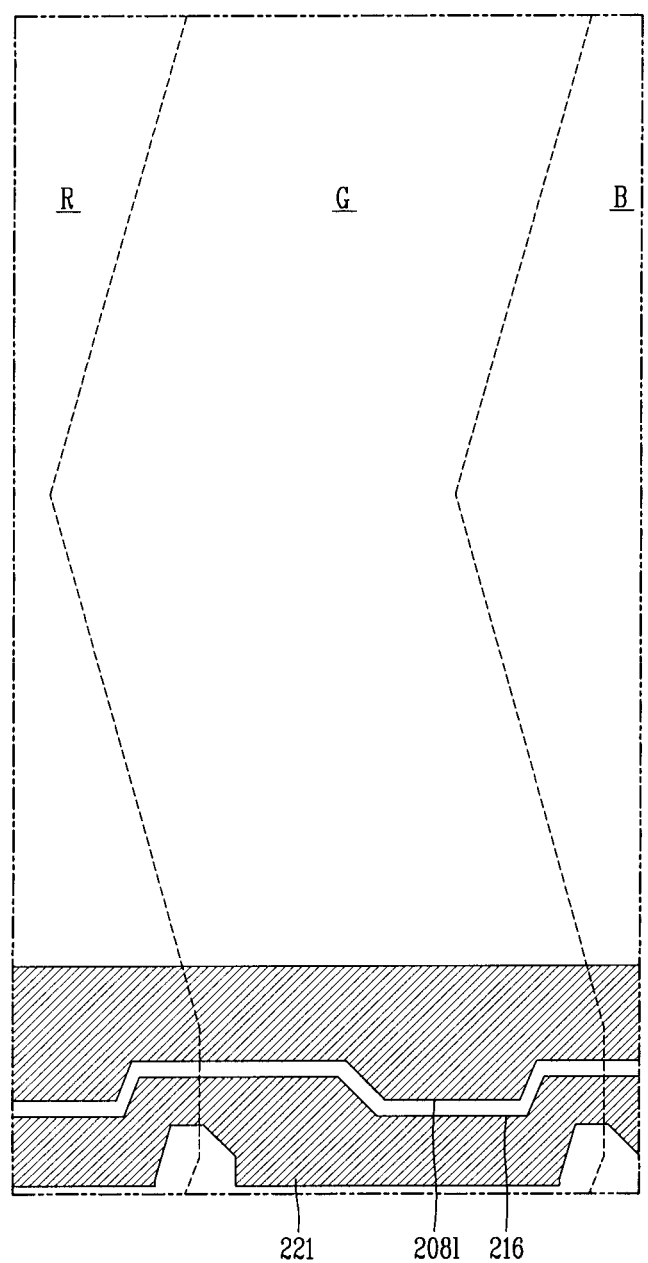
FIGS. 7A to 7H are top plan views sequentially showing a fabrication process of the array substrate of FIG. 5 according to an embodiment of the present invention.
Figure 8A:
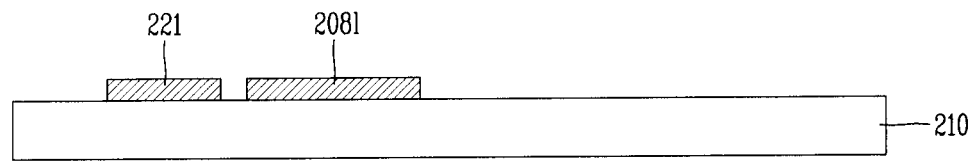
FIGS. 8A to 8H are cross-sectional views sequentially showing a fabrication process of the array substrate of FIG. 5 according to an embodiment of the present invention.

FIGS. 8A to 8H are cross-sectional views sequentially showing a fabrication process of the array substrate of FIG. 5 according to an embodiment of the present invention As shown in FIGS. 7A and 8A, a gate electrode 221, a gate line 216, and a common line 208l are formed on an array substrate 210 made of a transparent insulation material such as glass.

The gate electrode 221, the gate line 216, and the common line 208l are formed by depositing a first conductive film on the entire surface of the array substrate 210 and selectively patterning the first conductive film by a photolithography process.

The first conductive film may be made of a low-resistance, opaque conductive material such as aluminum Al, aluminum alloy, Al alloy, tungsten W, copper Cu, chromium Cr, molybdenum Mo such as MoTi. Moreover, the first conductive film may have a multilayer structure where two or more low-resistance materials are laminated.

While the common line 208l is formed adjacent to the upper or lower side of the gate line 216, the common line 208l may be formed in a direction substantially parallel to the gate line 216. However, the present invention is not limited to this.

Figure 7B:
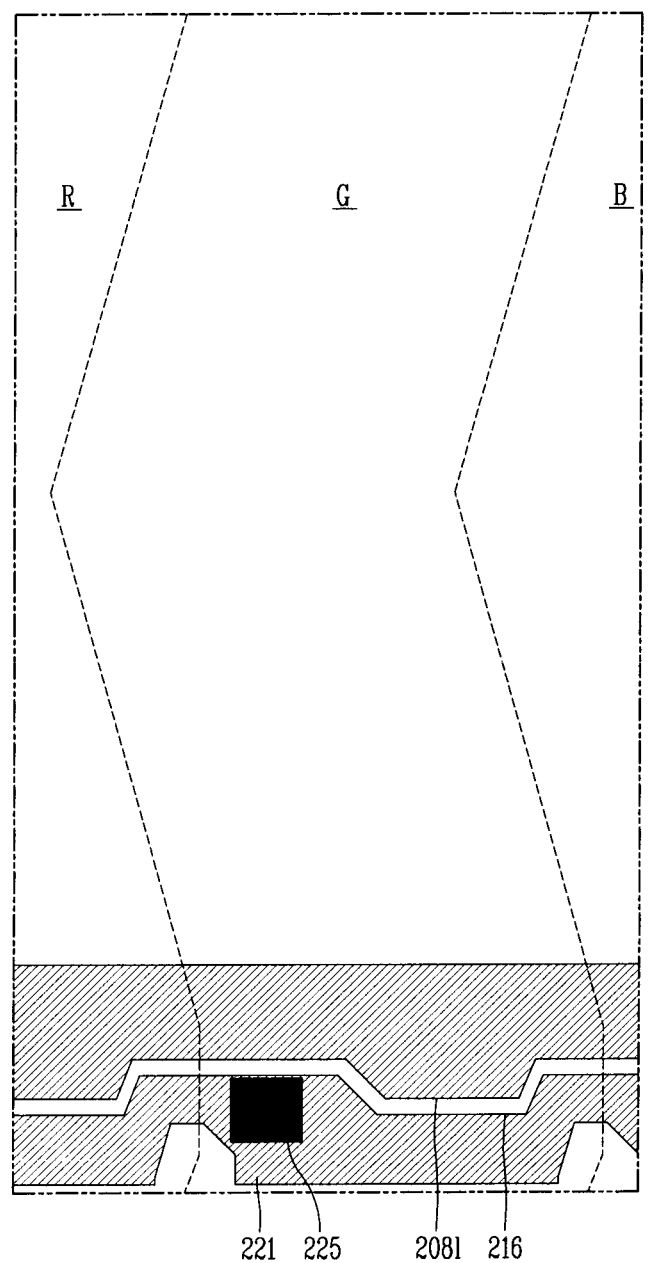
Figure 8B:
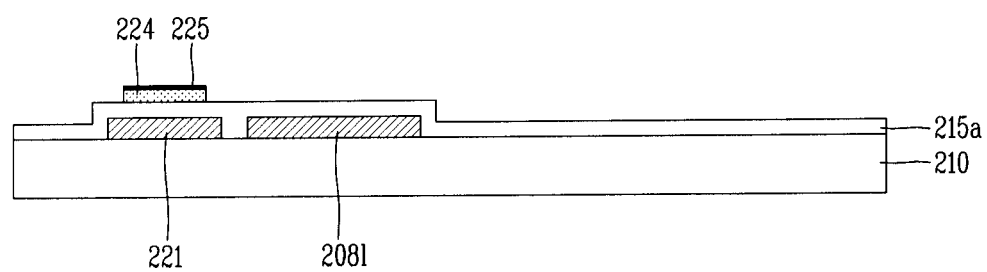

Next, as shown in FIGS. 7B and 8B, a gate insulation film 215a, an amorphous silicon thin film, and an n+ amorphous silicon thin film are formed on the entire surface of the array substrate 210 where the gate electrode 221, the gate line 216, and the common line 208l are formed.

Afterwards, an active pattern 224 made of the amorphous silicon thin film is formed over the gate electrode 221 of the array substrate 210 by selectively removing the amorphous silicon thin film and the n+ amorphous silicon thin film by a photolithography process.

Hereupon, an n+ amorphous silicon thin film pattern 225, which is made of the n+ amorphous silicon thin film and patterned in the same manner as the active pattern 224, is formed over the active pattern 224.

Figure 7C:
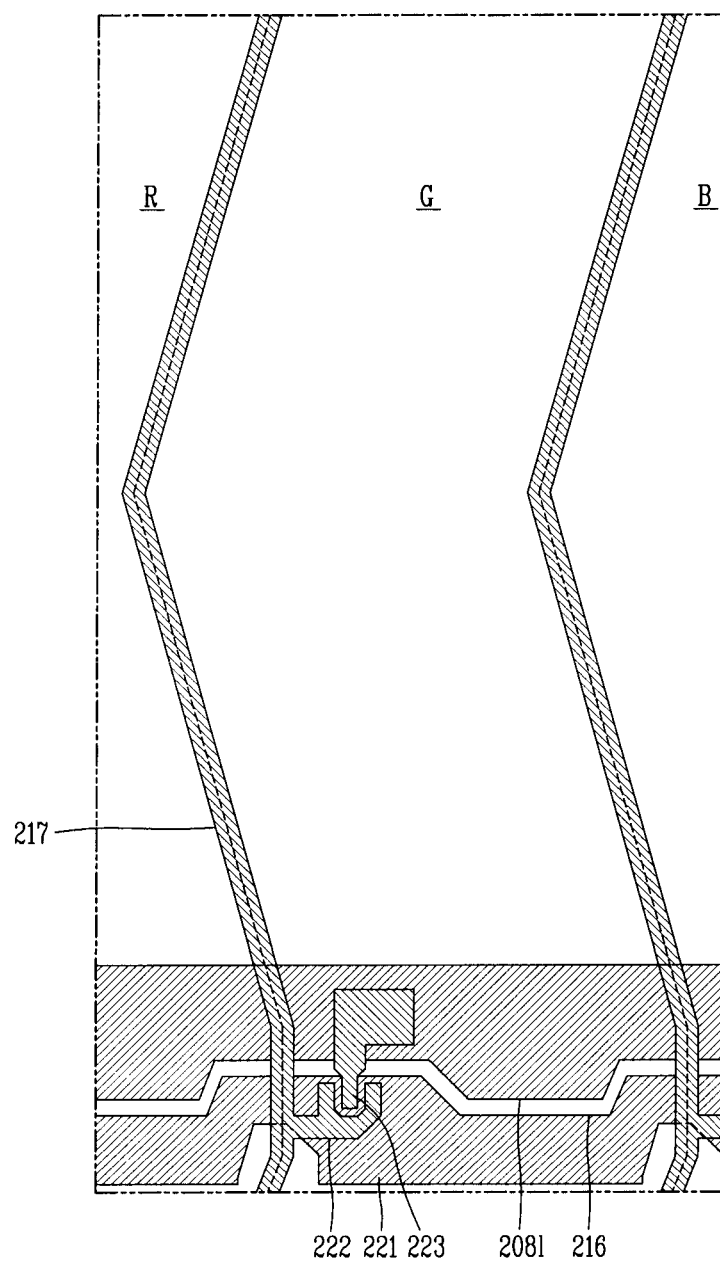
Figure 8C:
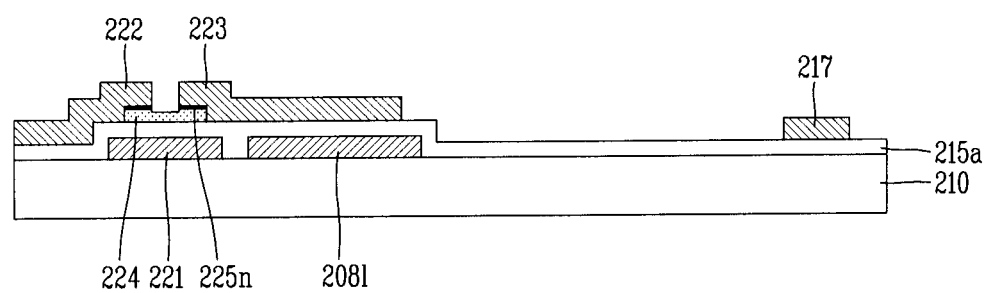

Next, as shown in FIGS. 7C and 8C, a second conductive film is formed on the entire surface of the array substrate 210 where the active pattern 224 and the n+ amorphous silicon thin film pattern 225 are formed.

The second conductive film may be made of a low-resistance, opaque conductive material such as aluminum Al, aluminum alloy, Al alloy, tungsten W, copper Cu, chromium Cr, molybdenum Mo such as MoTi, in order to form a source electrode, a drain electrode, and a data line. Moreover, the second conductive film may have a multilayer structure where two or more low-resistance materials are laminated.

Afterwards, a source electrode 222 and drain electrode 223 made of the second conductive film are formed over the active pattern 224 by selectively removing the n+ amorphous silicon thin film and the second conductive film by a photolithography process.

In addition, a data line 217 defining pixel regions, together with the gate line 216, is formed on the array substrate 210 by the photolithography process.

Hereupon, an ohmic-contact layer 225n made of the n+ amorphous silicon thin film is formed over the active pattern 224 to make an ohmic-contact between the source/drain regions of the active pattern 224 and the source/drain electrodes 222 and 223.

The data line 217, along with common electrodes and pixel electrodes to be formed later, may be bent to have a multi-domain structure allowing the liquid crystal molecules to be symmetrically driven.

While the embodiment of the present invention has been illustrated by taking an example where the active pattern 224, ohmic-contact layer 225n, and data line, i.e., the source electrode 222, drain electrode 223, and data line 217, are individually formed by performing a masking process twice, the present invention is not limited to this example. The active pattern 224, ohmic-contact layer 225n, and data line may be formed by performing a mask process only once using a half-tone mask or diffraction mask.

Next, as shown in FIGS. 7D to 7F and FIGS. 8D to 8F, an interlayer insulation film 215b is formed on the entire surface of the array substrate 210.

The interlayer insulation film 215b may be an inorganic insulation film such as a silicon nitride film SiNx or silicon oxide film SiO2 or an organic insulation film such as photo-acryl.

Afterwards, red, green, and blue color filters 207R, 207G, and 207B are formed within the pixel regions of the array substrate 210 where the interlayer insulation film 215b is formed.

Hereupon, a light blocking layer 227 is formed in vertical black matrix regions through which the gate line 216 and the common line 208l pass by mixing color pigments for the red, green, and blue color filters 207R, 207G, and 207B and laminating them.

Figure 7D:
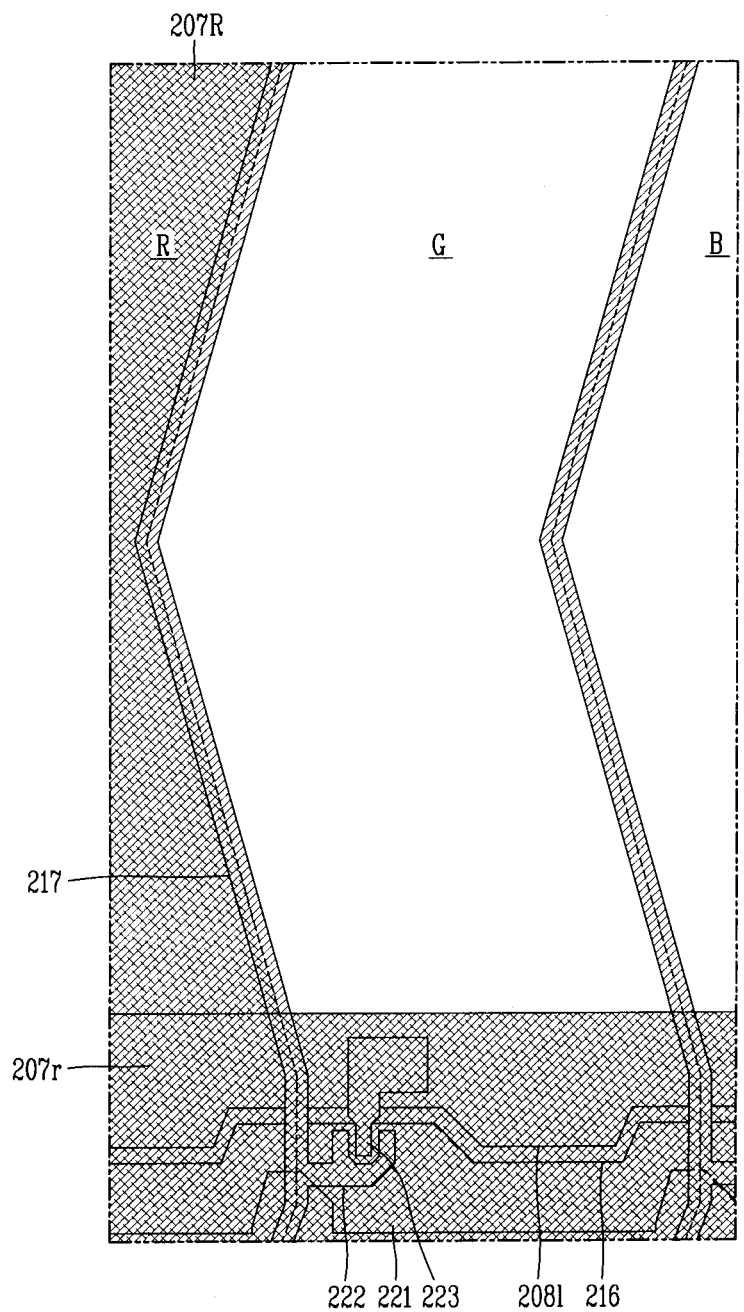
Figure 8D:
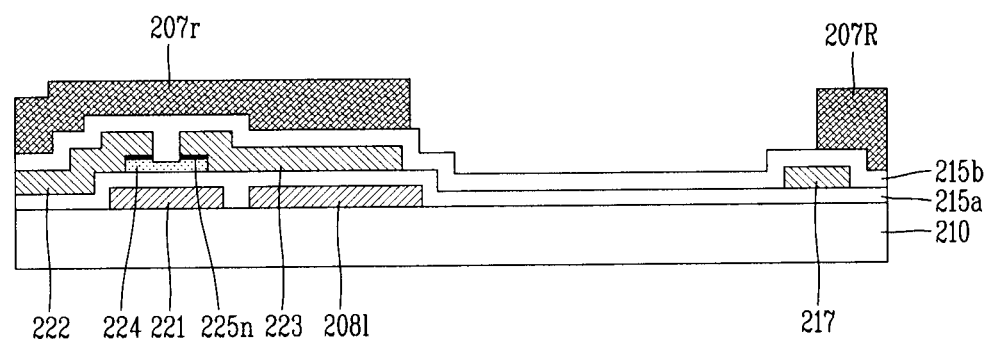

Specifically, as shown in FIGS. 7D and 8D, a red color filter 207R is formed within a red sub-pixel by applying a red color pigment to the entire surface of the array substrate 210 where the interlayer insulation film 215b is formed and then patterning it by a photolithography process. Hereupon, a red color layer 207r made of the red color pigment may be formed in the vertical black matrix regions.

Figure 7E:
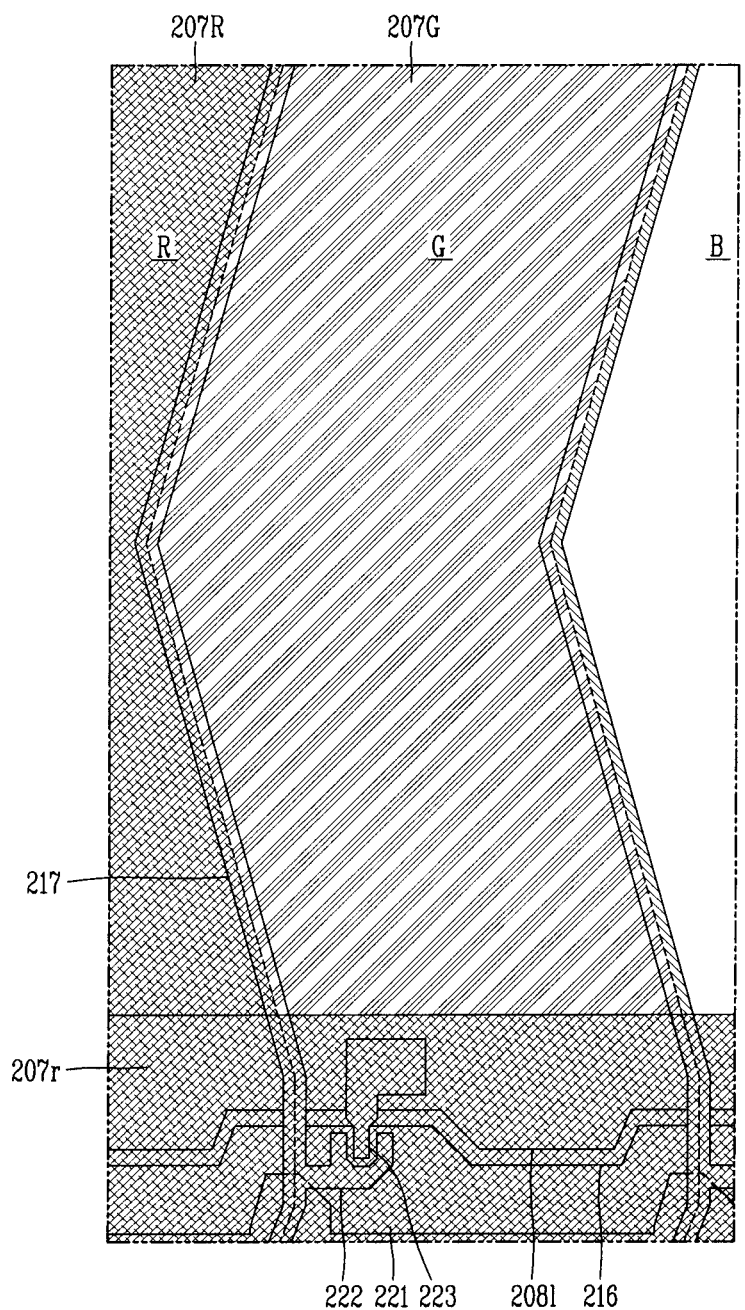
Figure 8E:
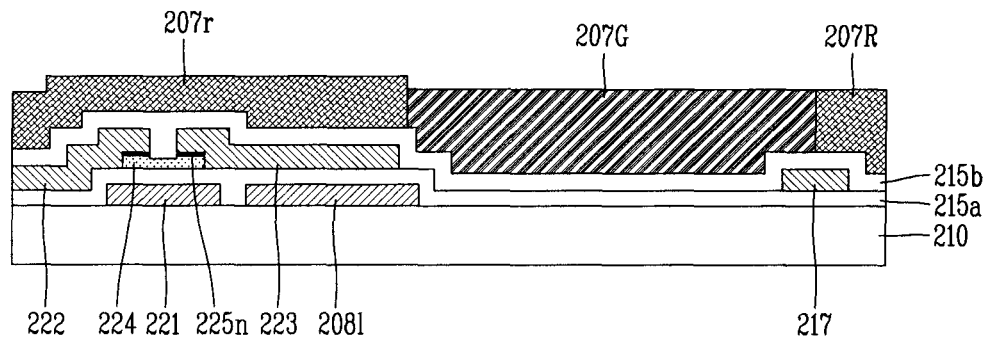

Next, as shown in FIG. 7E and FIG. 8E, a green color filter 207G is formed within a red sub-pixel by applying a green color pigment to the entire surface of the array substrate 210 where the red color filter 207R and the red color layer 207r are formed and then patterning it by a photolithography process.

Figure 7F:
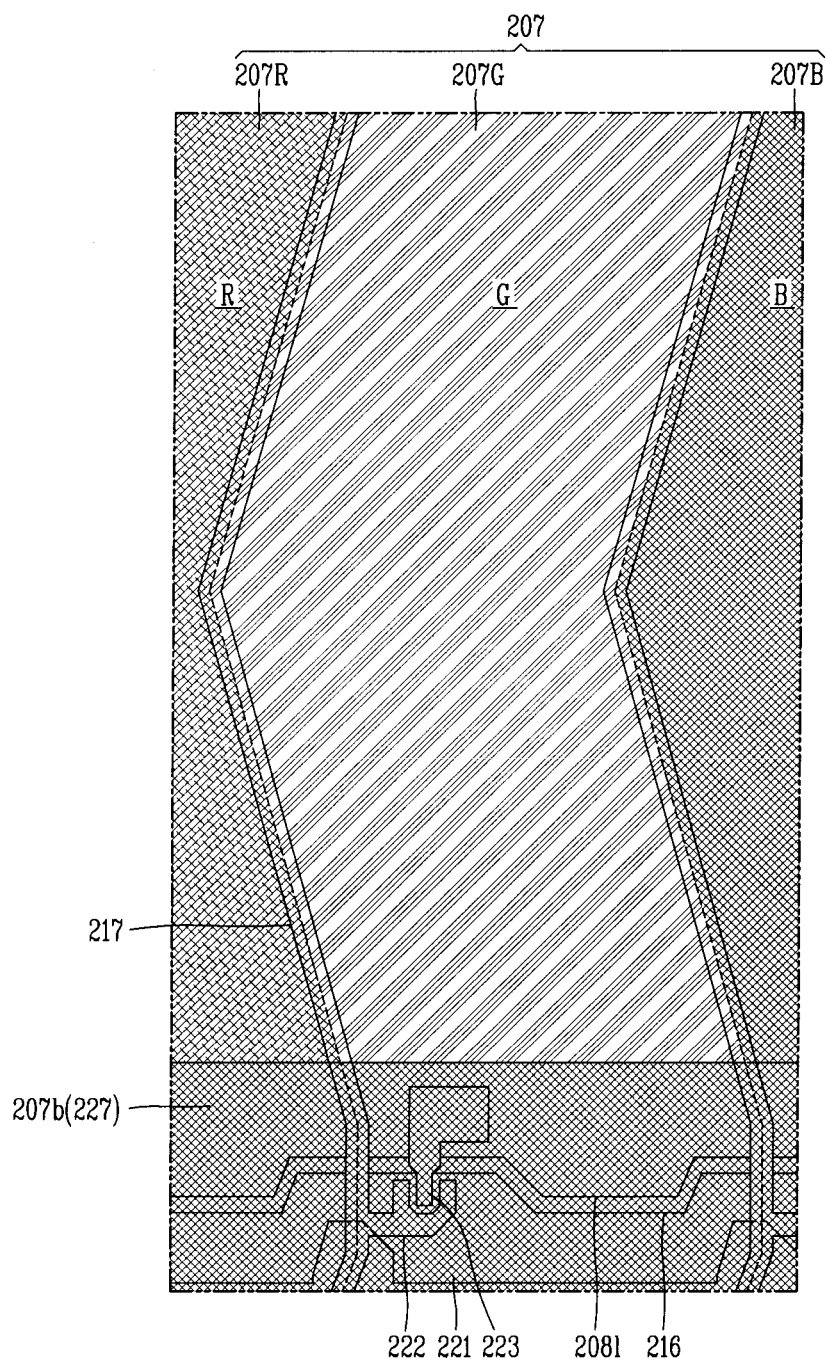
Figure 8F:
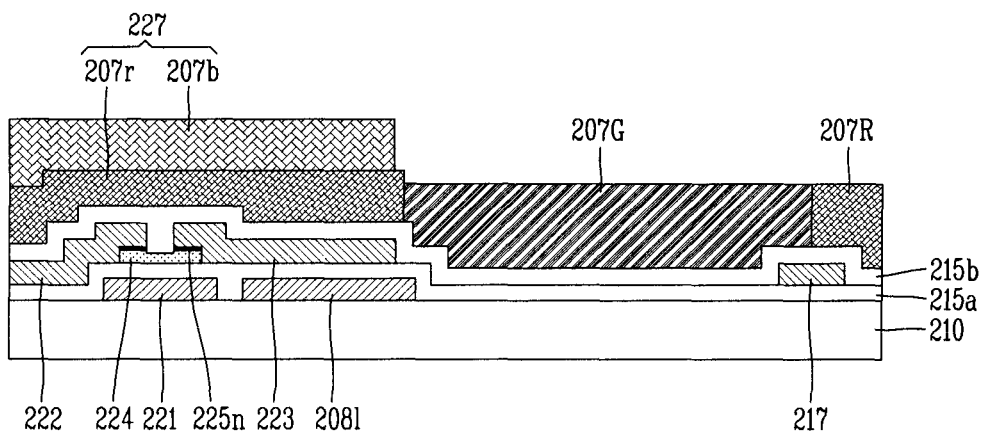

Next, as shown in FIG. 7F and FIG. 8F, a blue color filter 207B is formed within a blue sub-pixel by applying a blue color pigment to the entire surface of the array substrate 210 where the green color filter 207G is formed and then patterning it by a photolithography process. Hereupon, a blue color layer 207b made of the blue color pigment may be formed in the vertical black matrix regions where the red color layer 207r is formed. The red color layer 207r and blue color layer 207b laminated in the vertical black matrix regions constitute the light blocking layer 227.

Figure 7G:
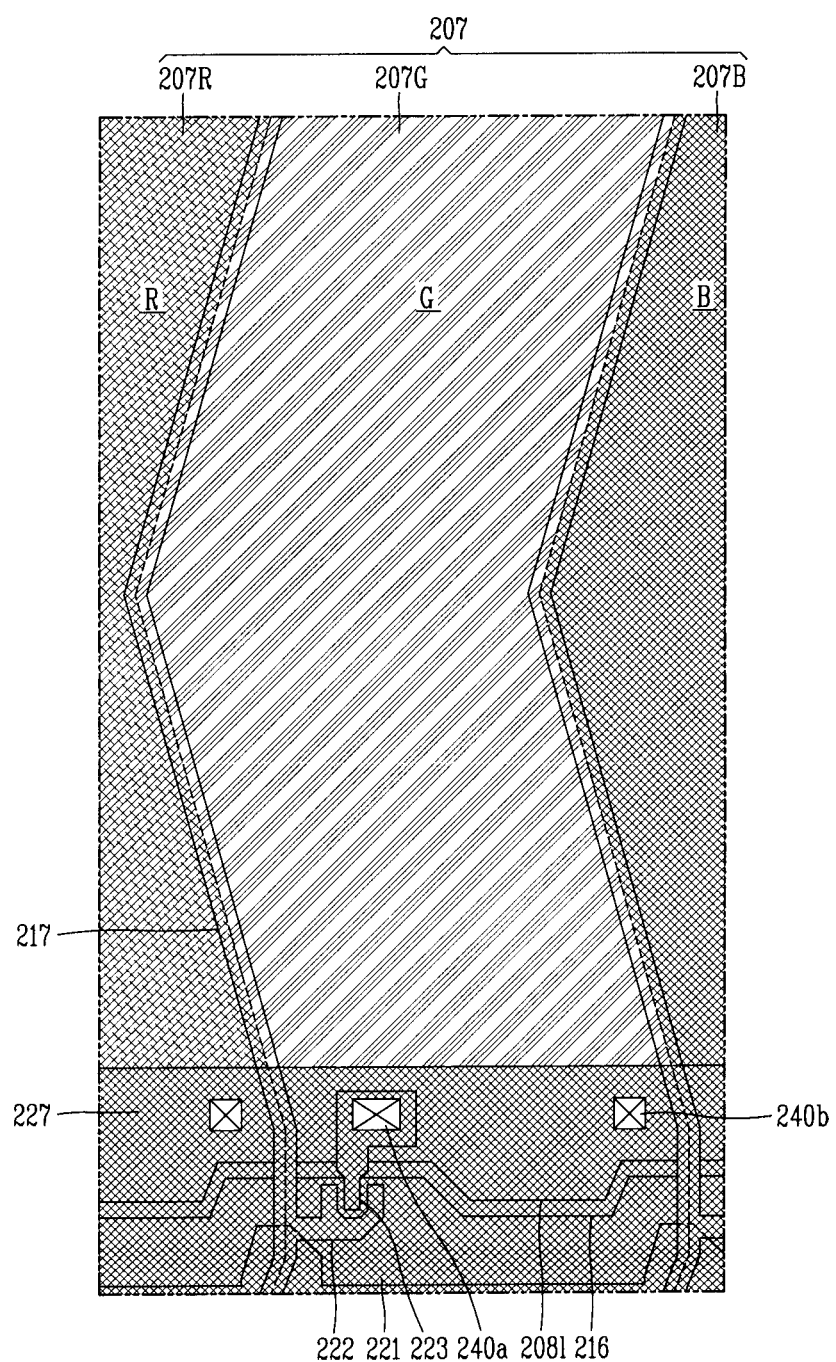
Figure 8G:
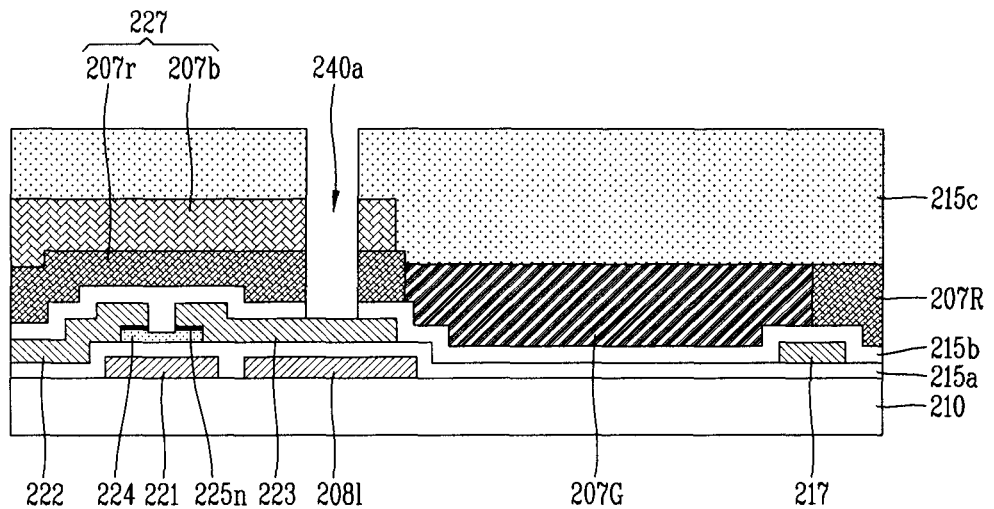

Next, as shown in FIG. 7G and FIG. 8G, a passivation film 215c is formed on the entire surface of the array substrate 210 where the color filters 207 are formed.

Afterwards, a first contact hole 240a and a second contact hole 240b that expose part of the drain electrode 223 and part of the common line 208l, respectively, by selective removing the gate insulation film 215a, the interlayer insulation film 215b, and the passivation film 215c by a photolithography process. However, the present invention is not limited to this, and the first contact hole 240a and the second contact hole 240b may be formed after the above-mentioned interlayer insulation film 215b is formed. In this case, the above-described red, green, and blue color filters 207R, 207G, and 207B are patterned in a way that exposes the first and second contact holes 240a and 240b.

Figure 7H:
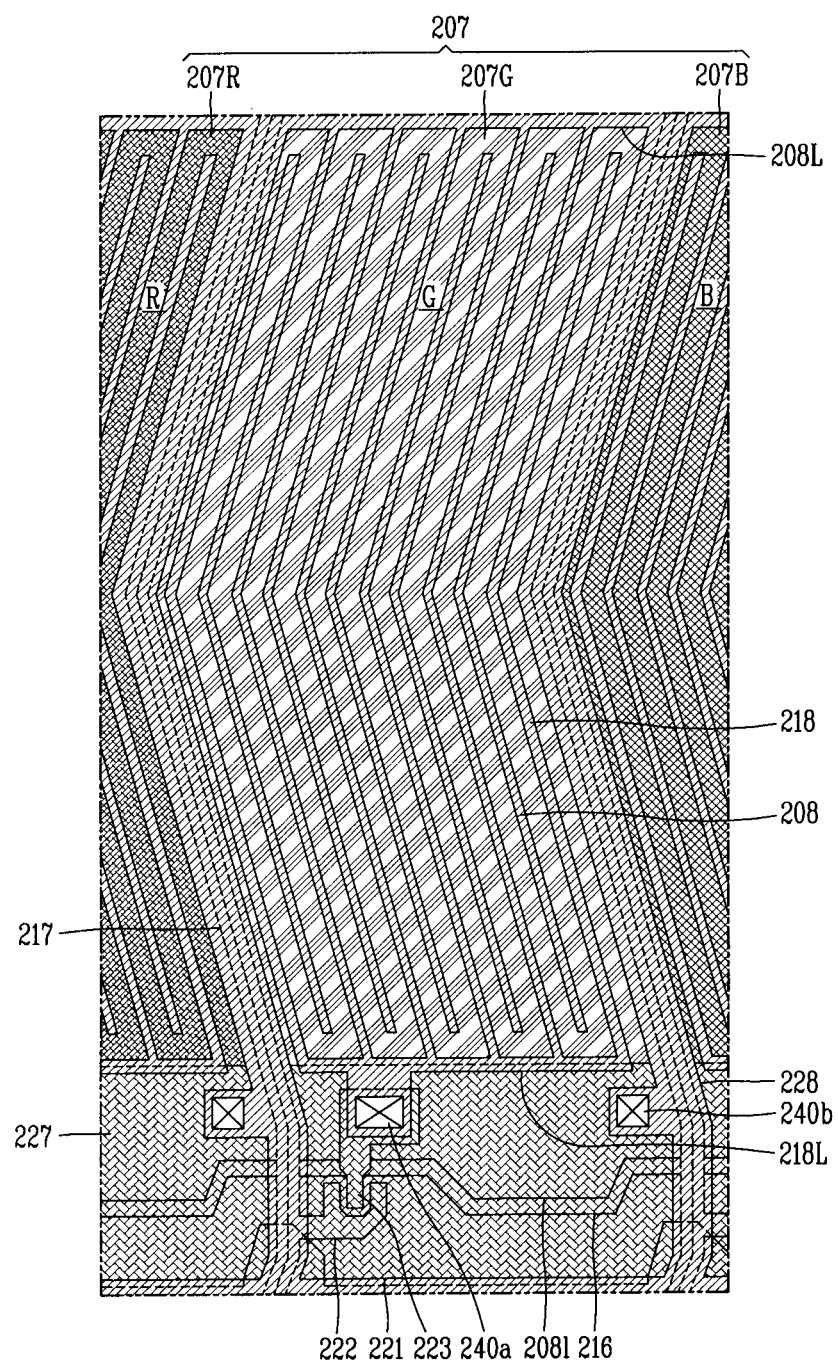
Figure 8H:
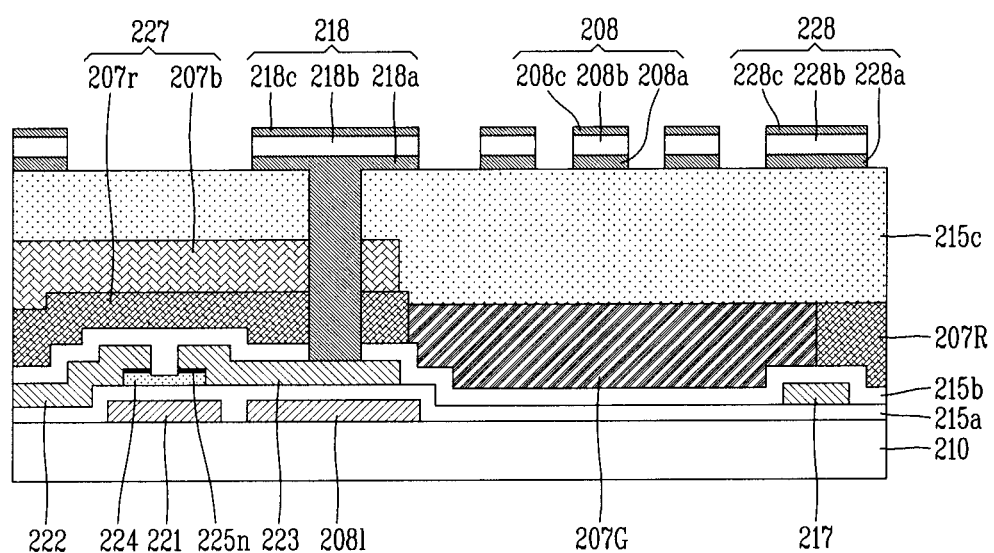

Next, as shown in FIG. 7H and FIG. 8H, a third conductive film, a fourth conductive film, and a fifth conductive film are formed on the entire surface of the array substrate 210 where the passivation film 215c is formed.

The fifth and third conductive films may be made of an opaque conductive material such as ceramic, metal oxide, MoTi, or copper to constitute common electrodes, pixel electrodes and upper and lower light blocking pattern layers, and the fourth conductive film may be made of a transparent conductive material such as ITO or IZO to constitute the common electrodes, the pixel electrodes, and an intermediate light blocking pattern layer.

The fifth conductive layer, fourth conductive layer, and third conductive layer may have a thickness of 30 to 100, 400 to 600 and 100 to 300 Å, respectively.

Afterwards, a plurality of common electrodes 208 and pixel electrodes 218 made up of the third, fourth, and fifth conductive films are formed within the pixel regions by selectively removing the third, fourth, and fifth conductive films by a photolithography process.

By selectively removing the third, fourth, and fifth conductive films by a photolithography process, a light blocking pattern 228 is formed at the left and right boundaries of the pixel regions, i.e., in horizontal black matrix regions, so as to cover the data line 217. That is, the light blocking pattern 228 may be formed in a way that opens as wide as possible within the vertical black matrix regions, in order to reduce internal reflection caused by the light blocking pattern 228.

Specifically, the common electrodes 208 may have a triple-layer structure consisting of lower and upper common electrode layers 208a and 208c with low reflection and transmission characteristics and an intermediate common electrode layer 208b which is light-transmissive. The light blocking pattern 228 may have a triple-layer structure consisting of lower and upper light blocking pattern layers 228a and 228c with low reflection and transmission characteristics and an intermediate light blocking pattern layer 228b which is light-transmissive.

One end of the common electrodes 208 and one end of the light blocking pattern 228 formed over the data line 217 are connected to a common electrode line 208L, which is in parallel with the gate line 216, and the common electrodes 208 and the light blocking pattern 228 are electrically connected to a common line 208L, which is parallel with the gate line 216, via the second contact hole 240b.

The pixel electrodes 218 may be made of the same material on the same plane as the common electrodes 208. That is, the pixel electrodes 218 may have a triple-layer structure consisting of lower and upper pixel electrode layers 218a and 218c with low reflection and transmission characteristics and an intermediate pixel electrode layer 218b which is light-transmissive.

One end of the pixel electrodes 218 are connected to a pixel electrode line 218L, which is in parallel with the gate line 216, and the pixel electrode line 218L is electrically connected to the drain electrode 223 of the thin film transistor exposed via a first contact hole 240a.

The common electrodes 208, the pixel electrodes 218, and the light blocking pattern 228 may have a bent structure like the data line 217 as described above.

Afterwards, the array substrate 210 thus configured is attached to the upper substrate facing it by a sealant formed on the outer edge of an image display area, with a predetermined cell gap maintained between them by a column spacer.

The thus-configured liquid crystal display device according to the embodiment of the present invention is applicable to an image panel of a polarized glasses-type stereoscopic image display device. In this case, the light blocking layer can solve the vertical viewing angle problem of the polarized glasses-type stereoscopic image display device as it constitutes black stripes.

Figure 9:
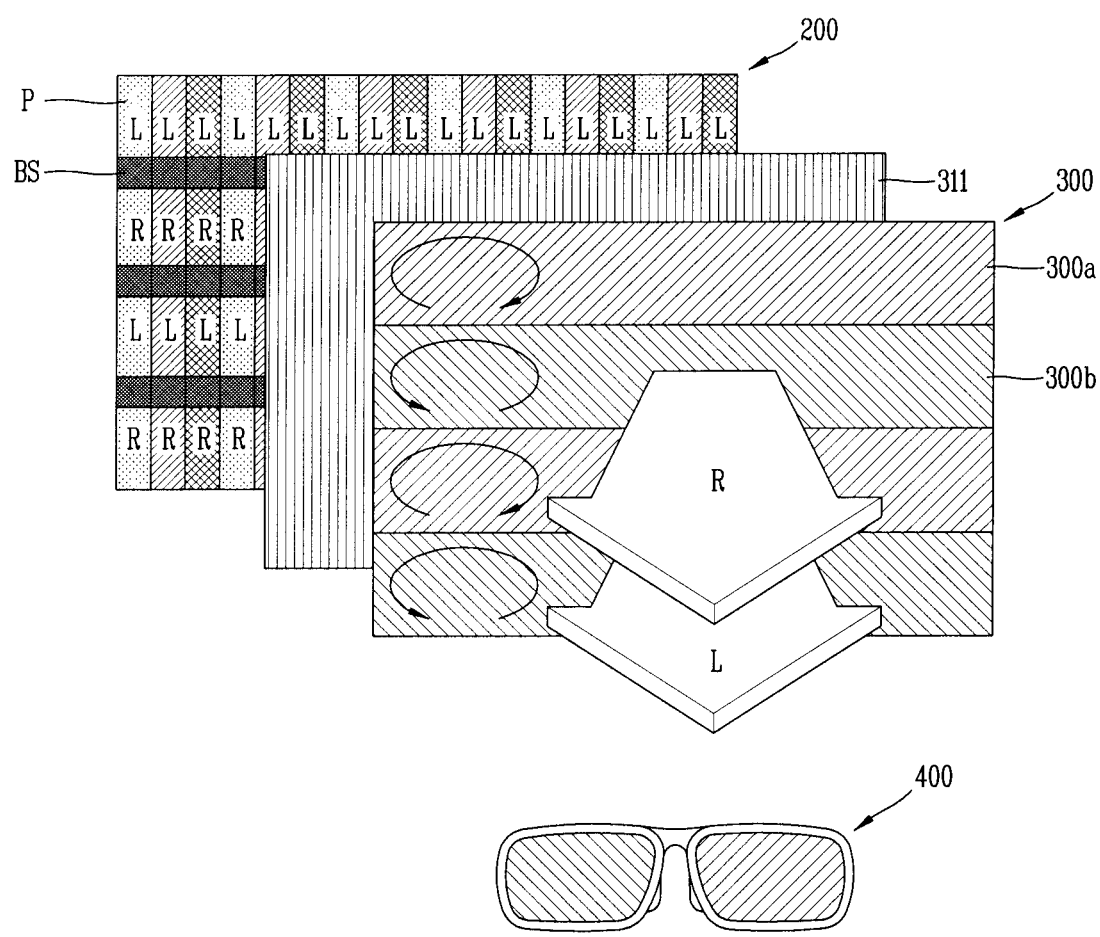
FIG. 9 is a view illustrating the structure of a stereoscopic image display device using the liquid crystal display device of the present invention as an image panel.

FIG. 9 is a view illustrating the structure of a stereoscopic image display device using the liquid crystal display device of the present invention as an image panel.

First of all, a 3D display can be simply defined as "a total system for artificially reproducing a 3D image."

This system includes a software technique for displaying an image in 3D and a hardware technique for actually rendering content created by this software technique into 3D. The reason why the software technique is included is because 3D display hardware requires content created in a different software approach for a different stereoscopic display method.

A virtual 3D display is a total system that gives a literally virtual 3D effect on planar display hardware using binocular disparity, one of the factors giving a 3D effect, which results from the eyes' horizontal separation by about 65 mm. In other words, our eyes have slightly different views of the same object (more precisely, the left and right eyes see slightly different spatial information) due to binocular disparity, and the brain accurately combines these two views coming from the retinae to give us a 3D view. Using binocular display image, the virtual 3D display is designed to create a virtual 3D effect by presenting two left and right images on a 2D display device and providing them to the left and right eyes.

In order for the virtual 3D display device to display images from two channels on a single screen, the images are output from the channels one by one in an alternating manner in a horizontal or vertical direction on a single screen. Once the two images from the two channels are output from a single display device, a right image is input to the right eye and a left image is input to the left eye in case of a auto-stereoscopic method due to a hardware structure. In case of a stereoscopic method using glasses, a right image is blocked so as not to be viewed by the left eye, and a left image is blocked so as not to be viewed by the right eye, by using special glasses.

Methods for displaying stereoscopic images are categorized largely into glasses-type methods and non-glasses type methods.

The glasses-type methods include an anaglyph method using red and cyan glasses for the left and right eyes, respectively, a polarized glasses method using polarized glasses with different directions of polarization for the left eye and the right eye, and a liquid crystal shutter method that periodically repeats a time-divided image and uses liquid crystal (LC) shutter glasses synchronized with the period of the time-divided image. Among these methods, the polarized glasses method has the advantage of easily rendering two 2D images into 3D images.

Referring to FIG. 9, the polarized glasses method is a method for spatially separating right and left images from each other by arranging a patterned retarder 300 on the front surface of an image panel 200, using a polarization phenomenon.

The patterned retarder 300 of the polarized glasses-type stereoscopic image display device indicates a film where predetermined patterns are formed at corresponding positions so that right and left images are polarized perpendicular to one other.

For instance, the patterned retarder 300 is provided with a glass substrate. Although not shown, an alignment layer and a bi-refractive layer are formed on the glass substrate. The alignment layer and the bi-refractive layer are provided with regular patterns of a first region 300a, and regular patterns of a second region 300b. The first region 300a and the second region 300b are formed of strips alternating with each other to correspond to image lines of the image panel 200. The first and second regions 300a and 300b have the same alignment direction. The first region 300a and the second region 300b may also have different alignment directions, e.g., about 45° and 135°.

The image panel 200 may be configured as one of a Liquid Crystal Display (LCD) device, a Field Emission Display (FED) device, a Plasma Display Panel (PDP) and an Electroluminescent Display (EL) device. If the image panel 200 is configured as an LCD device, an upper polarizing plate 311 having a light absorption axis in a horizontal direction is disposed between the image panel 200 and the patterned retarder 300. Although not shown, a backlight unit is disposed below the image panel 200, and a lower polarizing plate is disposed between the image panel 200 and the backlight unit.

The upper polarizing plate 311 is an analyzer attached onto the upper glass substrate of the image panel 200, which passes therethrough only specific linearly-polarized light, among light incident after passing through an LC layer of the image panel 200.

A widely-used 3D display method is a method for displaying right and left images on odd and even lines, or on even and odd lines, respectively. That is, as shown, 'L' images are disposed in odd lines and 'R' images are disposed in even lines in a vertical direction. Once the 'L' and 'R' images are displayed on the image panel 200, the viewer can appreciate 3D images by separately viewing the 'L' and 'R' images using stereoscopic glasses 400.

As aforementioned, the patterned retarder 300 is provided with regular patterns of a first region 300a and regular patterns of a second region 300b, the regular patterns arranged on odd and even lines in an alternating manner. For instance, the regular patterns of the first region 300a and the regular patterns of the second region 300b may be arranged on odd and even lines so as to form +45° and −45° with an absorption axis of the upper polarizing plate 311, respectively. The regular patterns of the first region 300a and the regular patterns of the second region 300b implement phase retardation of light by $\lambda/4$ using a bi-refractive medium. A light axis of the regular patterns of the first region 300a is orthogonal to a light axis of the regular patterns of the second region 300b. Therefore, the regular patterns of the first region 300a are arranged to face lines where the 'L' images of the image panel 200 are displayed, and are configured to convert light of the 'L' images to first polarized light (circularly or linearly polarized light). And, the regular patterns of the second region 300b are arranged to face lines where the 'R' images of the image panel 200 are displayed, and are configured to convert light of the 'R' images to second polarized light (circularly or linearly polarized light). For instance, the regular patterns of the first region 300a may be implemented as a polarizing filter for passing left-handed circularly polarization therethrough, and the regular patterns of the second region 300b may be implemented as a polarizing filter for passing right-handed circularly polarization therethrough.

A polarizing film for passing therethrough only a first polarizing component is attached to a left-eye lens of the stereoscopic glasses 400, and a polarizing film for passing therethrough only a second polarizing component is attached to a right-eye lens of the stereoscopic glasses 400. Therefore, a viewer wearing the stereoscopic glasses 400 can appreciate images as 3D images by viewing the 'L' images with the left eye, and by viewing the 'R' images with the right eye.

In the present invention, the polarized glasses method is implemented as a circularly polarizing method. However, the present invention is not limited to this. That is, the polarized glasses method may be also implemented as a linearly polarizing method.

In the polarized glasses-type stereoscopic image display device thus configured, predetermined black stripes BS are formed at the upper and lower boundaries of pixels P. For example, a light blocking layer formed on the lower glass substrate of the image panel 200 may be used as the black stripes BS.

In the 3D display method for displaying right and left images on odd and even lines, or on even and odd lines, respectively, 'L' and 'R' images vertically adjacent to each other are separated from each other by the black stripes BS made up of the light blocking layer, so that the 'L' images are input to the left eye and the 'R' images are input to the right eye.

While the embodiment of the present invention has been described taking as an example am amorphous silicon thin film transistor using an amorphous silicon thin film as an active pattern, the present invention is not limited to this example and can be applied to a polycrystalline silicon thin film transistor using a polycrystalline silicon thin film or an oxide thin film transistor using oxide semiconductor.

Furthermore, the present invention may be applicable to other display devices fabricated using a thin film transistor, for example, an organic electroluminescent display device with an organic light emitting diode OLED connected to a driving transistor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, the method comprising the steps of:
forming a gate line and a data line that cross each other on a first substrate to define red, green, and blue pixel regions;
forming a thin film transistor at the crossing of the gate line and the data line;
forming red, green, and blue color filters within the red, green, and blue pixel regions of the first substrate;
forming a light blocking layer at upper and lower boundaries of the pixel regions by laminating color pigments for the red, green, and blue color filters;
forming a plurality of common electrodes and pixel electrodes within the pixel regions of the first substrate where the red, green, and blue color filters and the light blocking layer are formed;
forming a light blocking pattern at left and right boundaries of the pixel regions over the data line; and
attaching the first substrate and a second substrate together,
wherein the common electrodes, the pixel electrodes, and the light blocking pattern have a triple-layer structure consisting of lower and upper layers with low reflection and transmission characteristics; and an intermediate layer that is light-transmissive.

2. The method of claim 1, further comprising of forming a common line parallel to the gate line, wherein the common line is adjacent an upper or lower side of the gate line.

3. The method of claim 2, wherein one end of the common electrodes and one end of the light blocking pattern are connected to a common electrode line, which is parallel with the gate line, and wherein the common electrode line is electrically connected to the underlying common line.

4. The method of claim 1, wherein one end of the pixel electrodes is connected to a pixel electrode line, which is in parallel with the gate line, and wherein the pixel electrode line is electrically connected to the drain electrode of the thin film transistor.

5. The method of claim 1, wherein the upper and lower layers of the common electrodes, pixel electrodes, and light blocking pattern are made of an opaque conductive material.

6. The method of claim 5, wherein the opaque conductive material is ceramic, metal oxide, MoTi, or copper.

7. The method of claim 1, wherein the intermediate layers of the common electrodes, pixel electrodes, and light blocking pattern are made of a transparent conductive material.

8. The method of claim 7, wherein the transparent conductive material is indium tin oxide (ITO) or indium zinc oxide (IZO).

9. The method of claim 1, wherein the upper layers, intermediate layers, and lower layers of the common electrodes, pixel electrodes, and light blocking pattern have a thickness of 30 to 100 Å, 400 to 600 Å, and 100 to 300 Å, respectively.

10. The method of claim 1, wherein the light blocking layer has a lamination structure of red and blue color layers made of color pigments for the red and blue color filters.

11. A liquid crystal display device comprising:
a gate line and a data line formed on a first substrate and crossing each other to define red, green, and blue pixel regions;
a thin film transistor formed at the crossing of the gate line and the data line;
red, green, and blue color filters formed within the red, green, and blue pixel regions of the first substrate where the thin film transistor is formed;
a light blocking layer formed at upper and lower boundaries of the pixel regions by laminating color pigments for the red, green, and blue color filters;
a plurality of common electrodes and pixel electrodes formed within the pixel regions of the first substrate where the red, green, and blue color filters and the light blocking layer are formed;
a light blocking pattern formed at left and right boundaries of the pixel regions over the data line; and
a second substrate attached to the first substrate and facing each other,
wherein the common electrodes, the pixel electrodes, and the light blocking pattern have a triple-layer structure consisting of lower and upper layers with low reflection and transmission characteristics, and an intermediate layer which is light-transmissive.

12. The liquid crystal display device of claim 11, further comprising a common line formed in parallel with the gate line, wherein the common line is adjacent to an upper or lower side of the gate line.

13. The liquid crystal display device of claim 12, wherein one end of the common electrodes and one end of the light blocking pattern are connected to a common electrode line, which is in parallel with the gate line, and wherein the common electrode line is electrically connected to the underlying common line.

14. The liquid crystal display device of claim 11, wherein one end of the pixel electrodes is connected to a pixel electrode line, which is in parallel with the gate line, and wherein the pixel electrode line is electrically connected to the drain electrode of the thin film transistor.

15. The liquid crystal display device of claim 11, wherein the upper and lower layers of the common electrodes, pixel electrodes, and light blocking pattern are made of an opaque conductive material.

16. The liquid crystal display device of claim 15, wherein the opaque conductive material is ceramic, metal oxide, MoTi, or copper.

17. The liquid crystal display device of claim 11, wherein the intermediate layer of the common electrodes, pixel electrodes, and light blocking pattern is made of a transparent conductive material.

18. The liquid crystal display device of claim 17, wherein the transparent conductive material is indium tin oxide (ITO) or indium zinc oxide (IZO).

19. The liquid crystal display device of claim 11, wherein the light blocking layer has a lamination structure of red and blue color layers made of color pigments for the red and blue color filters.

* * * * *